(12) United States Patent
Murphy

(10) Patent No.: US 10,199,088 B2
(45) Date of Patent: *Feb. 5, 2019

(54) APPARATUSES AND METHODS FOR CACHE INVALIDATE

(71) Applicant: Micron Technology, Inc., Boise, ID (US)

(72) Inventor: Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/112,563

(22) Filed: Aug. 24, 2018

(65) Prior Publication Data

US 2018/0366180 A1    Dec. 20, 2018

Related U.S. Application Data

(63) Continuation of application No. 15/066,674, filed on Mar. 10, 2016.

(51) Int. Cl.

| G06F 17/16 | (2006.01) |
| G11C 11/4091 | (2006.01) |
| G06F 12/0817 | (2016.01) |
| G06F 12/084 | (2016.01) |
| G11C 11/4097 | (2006.01) |
| G11C 7/10 | (2006.01) |
| G06F 12/0891 | (2016.01) |

(52) U.S. Cl.
CPC ........ *G11C 11/4091* (2013.01); *G06F 12/084* (2013.01); *G06F 12/0817* (2013.01); *G06F 12/0891* (2013.01); *G06F 2212/1016* (2013.01); *G06F 2212/1028* (2013.01); *G06F 2212/621* (2013.01); *G11C 7/1006* (2013.01); *G11C 11/4097* (2013.01); *G11C 2207/2245* (2013.01)

(58) Field of Classification Search
CPC ............. G06F 12/0808; G06F 12/0833; G06F 12/0891

See application file for complete search history.

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| EP | 0214718 | 3/1987 |

(Continued)

OTHER PUBLICATIONS

International Search Report and Written Opinion for related PCT Application No. PCT/US2017/021041, dated May 24, 2017, 14 pages.

(Continued)

*Primary Examiner* — David Yi
*Assistant Examiner* — Candice A Rankin
(74) *Attorney, Agent, or Firm* — Brooks, Cameron & Huebsch, PLLC

(57) ABSTRACT

The present disclosure includes apparatuses and methods for cache invalidate. An example apparatus comprises a bit vector capable memory device and a channel controller coupled to the memory device. The channel controller is configured to cause a bulk invalidate command to be sent to a cache memory system responsive to receipt of a bit vector operation request.

18 Claims, 8 Drawing Sheets

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,699,551 A | 12/1997 | Taylor et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,961,628 A | 10/1999 | Nguyen et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,725,337 B1 | 4/2004 | Tan et al. |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |

(56) References Cited

U.S. PATENT DOCUMENTS

| | | |
|---|---|---|
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,432,298 B1 | 8/2016 | Smith |
| 9,659,605 B1 | 5/2017 | Zawodny et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0229879 A1 | 12/2003 | Lin et al. |
| 2004/0059871 A1 | 3/2004 | Armilli et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0103251 A1 | 5/2004 | Alsup |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0143550 A1 | 6/2007 | Rajwar et al. |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0114942 A1 | 5/2008 | Brown et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0205185 A1 | 8/2008 | Shim |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0139007 A1 | 5/2013 | Higo et al. |
| 2013/0163362 A1 | 6/2013 | Kim |
| 2013/0173834 A1 | 7/2013 | Glaser et al. |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0019691 A1 | 1/2014 | Dally |
| 2014/0095801 A1 | 4/2014 | Bodas et al. |
| 2014/0101390 A1 | 4/2014 | Sohi et al. |
| 2014/0185395 A1 | 7/2014 | Seo |
| 2014/0215185 A1 | 7/2014 | Danielsen |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0029798 A1 | 1/2015 | Manning |
| 2015/0032940 A1 | 1/2015 | Karamcheti et al. |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0268711 A1 | 9/2015 | Ramani et al. |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0026571 A1 | 1/2016 | Fukuyama |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0170883 A1 | 6/2016 | Sasanka et al. |
| 2016/0188341 A1 | 6/2016 | Ould-Ahmed-Vall et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |

(56) References Cited

FOREIGN PATENT DOCUMENTS

| KR | 10-0211482 | 8/1998 |
|---|---|---|
| KR | 10-2010-0134235 | 12/2010 |
| KR | 10-2013-0049421 | 5/2013 |
| TW | 591384 | 6/2004 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Office Action for related Taiwan Patent Application No. 106108061, dated Oct. 27, 2017, 15 pages.

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory As a Programmable Logic Device," filed =Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

APPARATUSES AND METHODS FOR CACHE INVALIDATE

PRIORITY INFORMATION

This application is a Continuation of U.S. application Ser. No. 15/066,674, filed Mar. 10, 2016, the contents of which are included herein by reference.

TECHNICAL FIELD

The present disclosure relates generally to semiconductor memory and methods, and more particularly, to apparatuses and methods for cache invalidate.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource (e.g., CPU) can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing resources, computing performance and power consumption.

In many instances, the processing resources (e.g., processor and/or associated functional unit circuitry) may be external to the memory array, and data is accessed via a bus between the processing resources and the memory array to execute a set of instructions. Processing performance may be improved in a processing in memory (PIM) device, in which a processor may be implemented internal and/or near to a memory (e.g., directly on a same chip as the memory array). As used herein, a PIM device is intended to mean a device in which a processing capability is implemented internal and/or near a memory. PIM device may save time by reducing and/or eliminating external communications and may also conserve power. PIM operations can involve bit vector based operations. Bit vector based operations are performed on contiguous bits (also referred to as "chunks") in a virtual address space. For example, a chunk of virtual address space may have a contiguous bit length of 256 bits. The contiguous chunks of virtual address space may or may not be contiguous physically.

A typical cache architecture (fully associative, set associative, or direct mapped) uses part of an address generated by a processor to locate the placement of a block of data in the cache (also referred to herein as a "cache block") and may have some metadata (e.g., valid and dirty bits) describing the state of the cache block. A cache tag is a unique identifier for a group of data in the cache. A last level cache architecture may be based on 3D integrated memory, with tags and meta data being stored on-chip in SRAM and the blocks of cache data in quickly accessed DRAM. In such an architecture, the matching occurs using the on-chip SRAM tags and the memory access is accelerated by the relatively fast on-package DRAM (as compared to an off-package solution).

A cache architecture may have multiple levels of cache operating with multiple processing resources (processor cores). For example, a laptop may have two processing cores and two levels of cache, one for instructions and one for data. The second level cache (L2) may be referred to as the last level cache (LLC) and be able to store 256 kilobytes of data. A server may have three or more levels of cache. In a three level cache the third level cache (L3) may serve as the last level cache (LLC). All of the processing cores should have the same view of memory. Accordingly, a cache based memory system will use some form of cache coherency protocol, e.g., either a MESI (modified, exclusive, shared, invalid) or directory based cache coherency protocol, in order to maintain access to accurate data in the cache memory system between the processing cores.

Code running on a processing core may want to access a bit vector operation device, e.g., PIM device, to perform a bit vector based operation. A processing resource in a host is generally aware of its own cache line bit length (a cache line can also be referred to herein as a "cache block") to maintain its cache coherency. However, a bit vector based operation in a PIM device may operate on bit vectors of a much different bit length. A typical use pattern for performing a bit vector based operation while maintaining cache coherency in software may involve expensive flushing of an entire cache or marking particular pages as uncacheable (not available to use in the cache). Flushing cache memory involves writing an entire block of cache entries back to memory and deleting the cache entries to free up space for use in the cache memory. Flushing an entire cache memory may unnecessarily remove useable cache entries from the cache memory and consumes a significant amount of power and time in performing the operation.

By contrast, marking cache entries as invalid (also referred to as "invalidating" cache entries or "cache invalidate"), involves marking specific cache entries, e.g., specific cache lines, and deleting just those cache entries to free up space for use for another purpose in the cache memory. Hence, a cache invalidate command to write a specific cache entry, e.g., cache line, back to memory and to delete the cache entry in cache memory for another purpose consumes less power and time than a flushing operation. A cache invalidate operation is one technique for ensuring that data is consistent between a host device and a memory device. However, to make a PIM device fully cache coherency protocol aware would be very costly and complex.

DETAILED DESCRIPTION

Figure 1A:
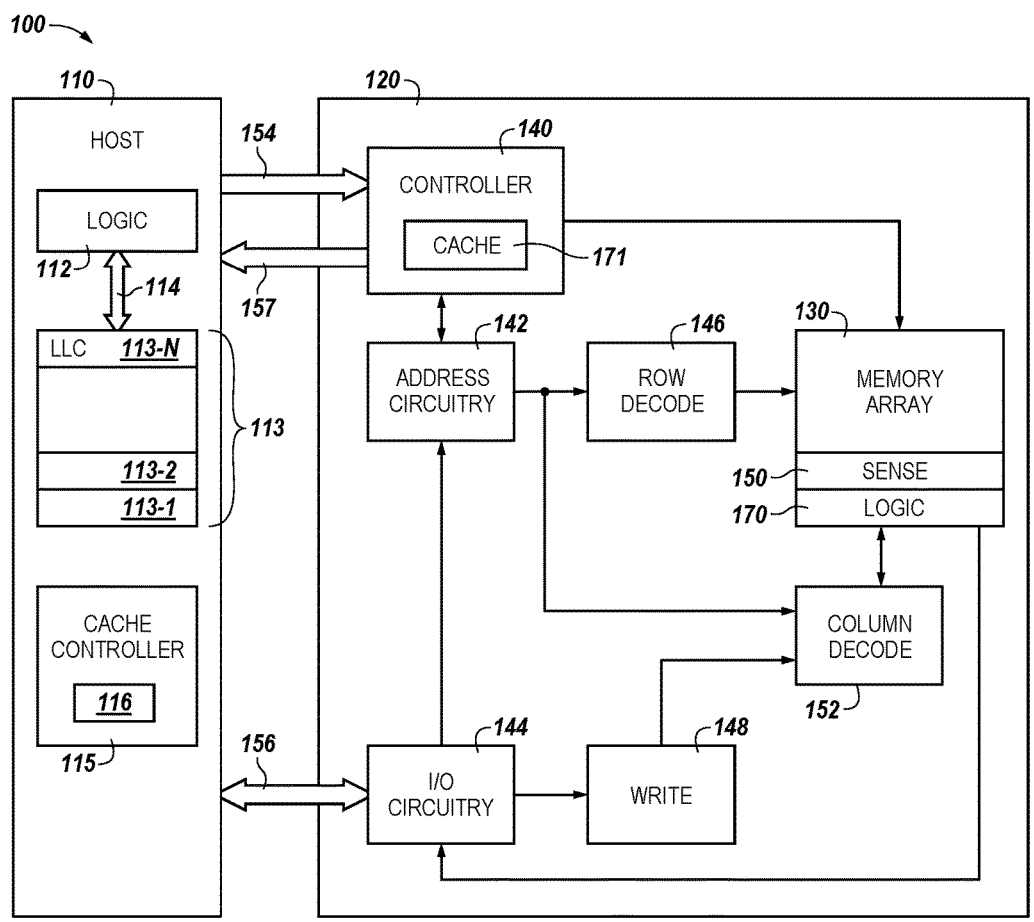
FIG. 1A is a block diagram of an apparatus in the form of a computing system including a memory device in accordance with a number of embodiments of the present disclosure.

The present disclosure includes apparatuses and methods for cache invalidate. Cache invalidate embodiments described herein may enable a bit vector based operation request to be performed on a bit vector operation memory device, e.g., a processor-in-memory (PIM) device, and more efficiently interact with a cache based memory system on separate device (e.g., a "host" processing resource) having a cache line bit length different from a bit vector bit length. For example, a cache line in a cache based memory system may have a 128 byte (one kilobit) bit length, including metadata and tags along with cache block data. In contrast, a bit vector operation memory device, e.g., PIM device, may operate on blocks of data in "chunks" that are equivalent to a block width in a DRAM array or equal to a different selected bit width depending on a particular design implementation. In one embodiment a chunk may be chosen to have a bit width of 256 bits to match a width of a particular interface bandwidth. Hence, four (4) chunks may total to a cache line bit length of 128 bytes in a cache based memory system.

As used herein, the term "bit vector" is intended to mean a physically contiguous number of bits. The physically contiguous number of bits may exist, e.g., be stored, on a bit vector memory device, e.g., PIM device, whether physically contiguous in rows (e.g., horizontally oriented) or physically contiguous in columns (e.g., vertically oriented) in an array of memory cells on the bit vector memory device. As used herein a "bit vector operation" is intended to mean an operation that is performed on a bit-vector that is a contiguous portion (also referred to as "chunk") of virtual address space, e.g., used by the PIM device. A chunk may or may not be contiguous physically to other chunks in the virtual address space.

In one example embodiment, an apparatus comprises a memory device having an array of memory cells and sensing circuitry coupled to the array. The sensing circuitry includes a sense amplifier and a compute component configured to implement logical operations. A memory controller is coupled to the array and sensing circuitry and is configured to receive a bit vector operation request. A channel controller is coupled to the memory device and is configured to cause a bulk invalidate command to be sent to a cache memory system responsive to receipt of a bit vector operation request. As used herein, a cache memory system (also referred as a "cache based memory system") is intended to mean an apparatus, e.g., component, device, system, etc., that associated with a particular cache coherency protocol. As used herein, the term "bulk invalidate" is intended to mean a capability to address and operate to invalidate information in multiple locations, e.g., multiple cache lines, without having to separately address and communicate invalidate instructions to each of the multiple locations. As mentioned above, marking cache entries as invalid (also referred to as "invalidating" cache entries or "cache invalidate") comprises deleting the contents of a cache entry to free up space for use in the cache memory. In some embodiments described herein a cache invalidate operation frees up space in a cache memory for use with operations being performed on a PIM device.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1A is a block diagram of an apparatus in the form of a computing system including a memory device in accordance with a number of embodiments of the present disclosure. As shown in FIG. 1A a host 110 can include logic and/or processing resources 112, e.g., a compute component. As used herein, logic is intended to mean hardware such as transistor circuitry and/or one or more application specific integrated circuits (ASICs) and may also include firmware. In at least one embodiment the logic resource 112 can include a static random access memory (SRAM) memory on the logic resource 112 (also sometimes referred to as a "logic layer"). As shown in the example embodiment of FIG. 1A, the logic resource 112 can be coupled on the host 110 to a cache memory 113 on the host 110, e.g., on-package (also referred to as on-chip and/or on-die) such as in a 3D integrated memory. The logic component 112 can be coupled to the cache memory 113 via a wide interface 114, e.g., 256 bit interface. This interface may include through silicon vias (TSVs) as part of a 3D integrated memory having multiple memory die stacked on a logic die.

In one or more embodiments the cache memory 113 can have a plurality of cache levels, arrays, memory layers, banks, bank sections, subarrays, rows, etc. 113-1, 113-2, . . . , 113-N. Embodiments are not so limited. In at least one embodiment, a portion of the cache memory 113 may serve as a last layer cache (LLC) portion (level), e.g., 113-N, to cache memory 113. In this structure, the LLC 113-N can control block data alignment and, as will become apparent from the description herein, an overall data size of the cache memory 113 of a logic and/or 3D integrated memory chip may be reduced.

As shown in FIG. 1A a cache controller 115 may be provided which can include logic in the form of firmware and/or hardware, e.g., an application specific integrated circuit (ASIC), and/or software, e.g., instructions stored in memory and executed by the logic and/or processing resource 112. According to embodiments, firmware and/or software used by the cache controller 115 can include an invalidate engine 116 associated with a cache coherency protocol of the cache memory 113. In some embodiments, the cache controller 115 may be configured, e.g., by executing instructions and/or performing logic operations, to maintain a cache coherency protocol in association with cache lines (also referred to as "cache blocks") in the cache memory 113. A cache coherency protocol may be a MESI (modified, exclusive, shared, invalid) or directory based cache coherency protocol, etc. Embodiments are not limited to these examples. As used herein a cache line ("cache block") is intended to mean a basic unit for cache storage and may contain multiple bytes/words of data. In one or more embodiments the cache controller may add metadata to a cache line such as block select metadata and/or subrow select metadata. For example, block select metadata may enable an offset to the cache line and subrow select metadata may enable multiple sets to a set associative cache. In one embodiment the block select provides an offset to a page in a dynamic random access memory (DRAM).

In order to appreciate improved system operation techniques and apparatus for implementing such techniques, a discussion of a bit vector operation memory device, e.g., PIM device, and associated host, follows. According to various embodiments, instructions, e.g., PIM commands (microcode instructions), can be sent to a memory device having PIM capabilities to implement logical operations. The PIM device may store the PIM commands within a memory array and can be executed by a controller on the memory device without having to transfer commands back and forth with a host over a bus. The PIM commands may be executed on the memory device to perform logical operations on the memory device that may be completed in less time and using less power than performing logical operation on the host. Additionally, time and power saving advantages may be realized by reducing the amount of data that is moved around a computing system to process the requested memory array operations (e.g., reads, writes, etc.).

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with an array of memory cells and capable of performing compute functions.

Again, FIG. 1A is a block diagram of an apparatus in the form of a computing system 100 including a memory device 120 in accordance with a number of embodiments of the present disclosure. The host 110, logic resource 112, cache memory 113 and cache controller have been discussed in detail above. The memory device 120 shown in FIG. 1A can include a memory controller 140, a memory array 130 having sensing circuitry 150 and/or logic circuitry 170. Each of these as used herein might also be separately considered an "apparatus."

FIG. 1A shows the system 100 includes a host 110 coupled (e.g., connected) to the memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1A (and later with FIG. 1B) illustrates a system having a Von Neumann architecture, embodiments of the present disclosure can be implemented in non-Von Neumann architectures, which may not include one or more components (e.g., CPU, ALU, etc.) often associated with a Von Neumann architecture.

The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a data bus 156 (e.g., an I/O bus) through I/O circuitry 144. Status and/or exception information can be provided from the memory controller 140 on the memory device 120 to a channel controller 143 (shown in FIG. 1B), including an out-of-band bus 157 (shown in FIG. 1B), which in turn can be provided from the memory device 120 to the host 110. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130.

Memory controller 140, e.g., bank control logic and/or sequencer, decodes signals provided by control bus 154, e.g., an address and control (A/C) bus, from the host 110. These signals can include chip enable signals, write enable signals, and address latch signals that are used to control operations performed on the memory array 130, including data read, data write, and data erase operations. In various embodiments, the memory controller 140 is responsible for executing instructions from the host 110. The memory controller 140 can be a state machine, a sequencer, or some other type of controller. The controller 140 can control shifting data (e.g., right or left) in an array, e.g., memory array 130.

Examples of the sensing circuitry 150 are described further below. For instance, in a number of embodiments, the sensing circuitry 150 can comprise a number of sense amplifiers and a number of compute components, which may serve as, and be referred to herein as, an accumulator and can be used to perform logical operations (e.g., on data associated with complementary data lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry. For example, compute functions can be performed without using a processor associated with a host 110 and/or other processing circuitry, such as ALU circuitry, located on device 120 (e.g., on controller 140 or elsewhere).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional peripheral sense amplifiers, registers, cache and/or data buffering, e.g., logic circuitry 170, can be coupled to the sensing circuitry 150 and can be used to store, e.g., cache and/or buffer, results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource). In effect, the array 130 and sensing circuitry can function according to embodiments as a compute enabled cache upon the memory controller 120 receiving and operating on a cache line 160 having block select 162 and subrow select 163 metadata structures.

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to an external register).

Figure 1B:
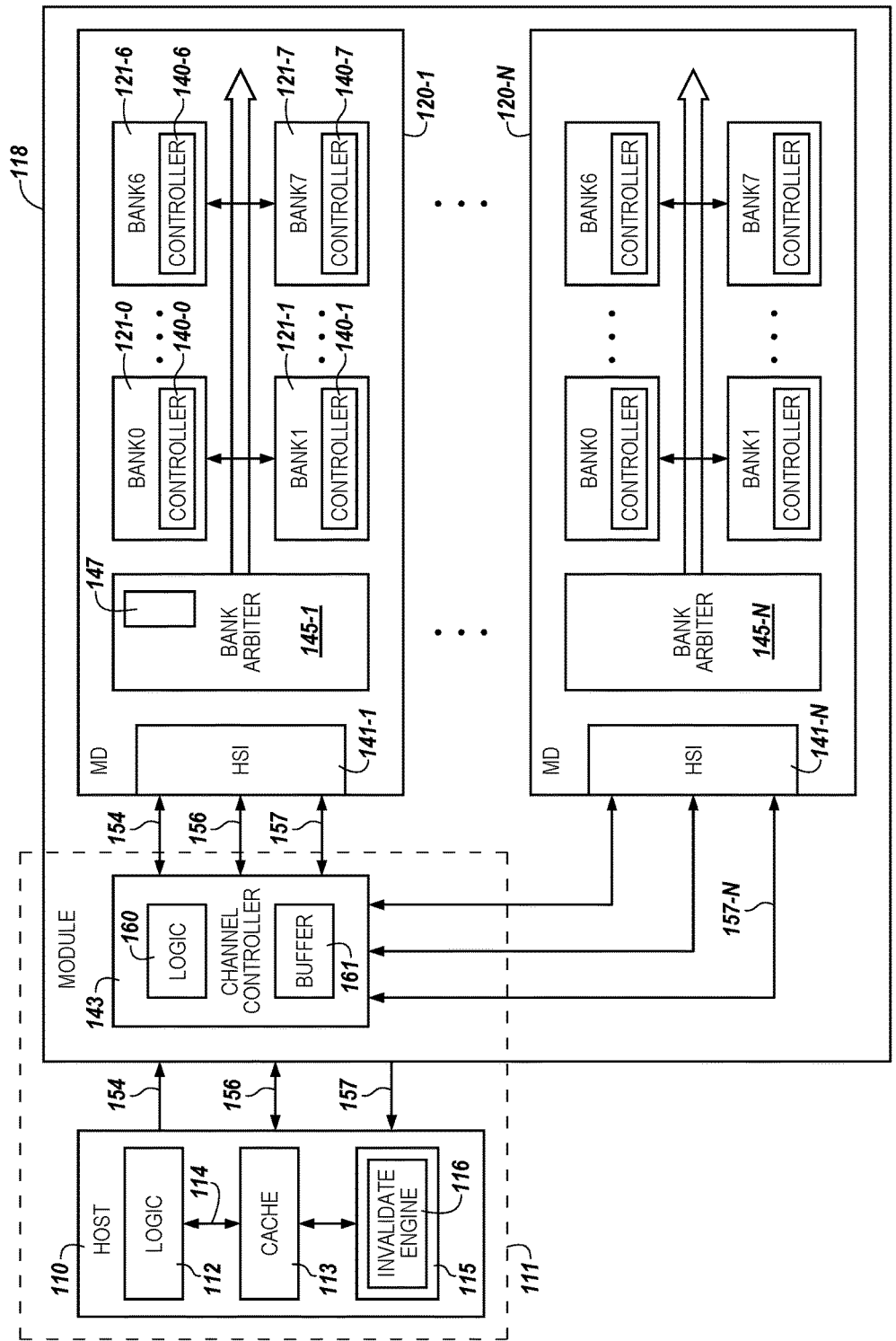
FIG. 1B is another block diagram of an apparatus in the form of a computing system including a memory device in accordance with a number of embodiments of the present disclosure.

FIG. 1B is a block diagram of another apparatus architecture in the form of a computing system 100 including a plurality of memory devices 120-1, . . . , 120-N coupled to a host 110 via a channel controller 143 in accordance with a number of embodiments of the present disclosure. As used herein, a channel controller 143 is intended to include logic having hardware, e.g., in the form of an application specific integrated circuit (ASIC) and/or firmware to implement one or more particular functions. One example of a channel controller may include a state machine. Another example may include an embedded processing resource. The channel controller 143 includes logic to handle input/output (I/O) tasks to a device.

In at least one embodiment the channel controller 143 may be coupled to the plurality of memory devices 120-1, . . . , 120-N in an integrated manner in the form of a module 118, e.g., formed on same chip with the plurality of memory devices 120-1, . . . , 120-N. In an alternative embodiment, the channel controller 143 may be integrated with the host 110, as illustrated by dashed lines 111, e.g., formed on a separate chip from the plurality of memory devices 120-1, . . . , 120-N. The channel controller 143 can be coupled to each of the plurality of memory devices 120-1, . . . , 120-N via a control bus 154 as described in FIG. 1A which in turn can be coupled to the host 110. The channel controller 143 can also be coupled to each of the plurality of memory devices, 120-1, . . . , 120-N via a data bus 156 as described in FIG. 1A which in turn can be coupled to the host 110. In addition, the channel controller 143 can be coupled to each of the plurality of memory devices 120-1, . . . , 120-N via an out-of-bound (OOB) bus 157 associated with a high speed interface (HSI) 141 that is configured to report status, exception and other data information to the channel controller 143 to exchange with the host 110.

According to various embodiments, the channel controller 143 is coupled to the plurality of memory devices 120-1, . . . , 120-N and is configured to cause a bulk invalidate command to be sent to a cache memory system responsive to receipt of a bit vector operation request. In at least one embodiment, the channel controller 143 includes logic 160 configured to generate the bulk invalidate command responsive to receipt of a bit vector operation request. Additionally, the channel controller 143 may receive status and exception information from a high speed interface (HSI) (also referred to herein as a status channel interface) 141 associated with a bank arbiter 145 in each of the plurality of memory devices 120-1, . . . , 120-N. In the example of FIG. 1B, each of the plurality of memory devices 120-1, . . . , 120-N can include a bank arbiter 145 to sequence control and data with a plurality of banks, e.g., Bank zero (0), Bank one (1), . . . , Bank six (6), Bank seven (7), etc. Each of the plurality of banks, Bank 0, . . . , Bank 7, can include a memory controller 140 and other components, including an array of memory cells 130 and sensing circuitry 150, logic circuitry 170, etc., as described in connection with FIG. 1A.

For example, each of the plurality of banks, e.g., Bank 0, . . . , Bank 7, in the plurality of memory devices 120-1, . . . , 120-N can include address circuitry 142 to latch address signals provided over a control bus 154 and can include I/O circuitry 144 to receive data provided over a data bus 156. Status and/or exception information can be provided from the memory controller 140 on the memory device 120 to the channel controller 143. The channel controller 143 is configured to cause a bulk invalidate command to be sent to a cache memory system responsive to receipt of a bit vector operation request and may use the control bus 154 and/or the OOB bus 157 to communicate between the plurality of memory devices 120-1, . . . , 120-N and the host 110.

For each of the plurality of banks, e.g., Bank 0, . . . , Bank 7, address signals can be received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130 and the OOB bus 157 can be used to report status, exception and other data information to the channel controller 143.

The channel controller 143 can include one or more local buffers 161 to store instructions and can include logic 160 to allocate a plurality of locations, e.g., subarrays or portions of subarrays, in the arrays of each respective bank to store bank commands, and arguments, (PIM commands) for the various banks in association with the operation of each of the plurality of memory devices 120-1, . . . , 120-N. The channel controller 143 can send commands, e.g., PIM commands, to the plurality of memory devices 120-1, . . . , 120-N to store those program instructions within a given bank of a memory device.

According to embodiments, the channel controller 143 can include logic 160 to convert bit vector addresses having a bit length used by a bit vector operation memory device, e.g., PIM device, to cache line addresses having a different bit length used by a cache memory system. Further the channel controller 143 can include logic 160 to cause a bulk invalidate command to be sent to a cache memory system. An example of a cache memory system, as the term is used herein, is represented by the cache memory 113, logic resource 112, cache controller 115 and/or invalidate engine 116, associated with a host 110, as shown in FIG. 1A. As noted above, the term "bulk invalidate" is intended to mean a capability to address and to operate on to invalidate information in multiple locations, e.g., multiple cache lines, without having to separately address and communicate invalidate instructions to each of the multiple locations. The bulk invalidate command includes instructions to cause the cache memory system to mark cache entries as invalid (also referred to as "invalidating" cache entries or "cache invalidate" operation).

Invalidating a cache entry or entire cache line comprises deleting the contents of a cache entry or line to free up space for other use in the cache memory, e.g., to hold PIM commands and/or PIM data associated with PIM operations. In some embodiments described herein a cache invalidate operation frees up space in a cache memory for use with operations being performed on a PIM device. As noted above, invalidating a cache entry or entire cache line is less costly in terms of time, power and resource usage than flushing a cache line or entire cache memory. Again, flushing cache memory involves writing cache entries back to memory and then deleting the cache entries to free up space for other use, e.g., PIM operations, in the cache memory. Invalidating a cache entry or entire cache line is additionally less costly than marking particular pages as uncacheable (not available to use in the cache) which just consumes valuable space on the cache memory system.

For example, embodiments disclosed herein may advantageously allow for multiple cache lines in a multi-level cache memory system to be invalidated using a single bulk invalidate command that is configured to be received by the cache memory system. In one example, a last level cache (LLC) may receive the bulk invalidate command which may be shared and operated upon by invalidate engines within each cache level to invalidate any cache line that may be in that cache level. In this manner, bandwidth resources may be conserved, operating speed may be increased and power consumption may be reduced. Additionally, in this manner a cache coherency protocol, e.g., MESI (modified, exclusive, shared, invalid) or directory based cache coherency protocol, used by the cache memory system may be adhered to while avoiding wasteful and costly (in terms of cache resources, power consumption, and time) flushing of an entire cache level and/or avoiding marking whole pages of cache as "uncacheable", by software, firmware and/or logic in use by a cache memory system. Further, embodiments may avoid developing costly architectures which endeavor to link a bit vector based operation device, e.g., PIMRAM device, having bit vectors of one bit length to a cache memory system having a cache line size of a different bit length. For example, making a PIMRAM architecture fully cache coherency protocol aware according to many various cache coherency protocols and systems would be a very complicated and costly, case by case, architectural design problem.

As described above in connection with FIG. 1A, the memory array 130 can be a DRAM array, SRAM array, STT RAM array, PCRAM array, TRAM array, RRAM array, 3D XPoint array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines.

As in FIG. 1A, a memory controller 140, e.g., bank control logic and/or sequencer, associated with any particular bank, Bank 0, ..., Bank 7, in a given memory device, 120-1, ..., 120-N, can decode signals provided by control bus 154 from the host 110. These signals can include chip enable signals, write enable signals, and address latch signals that are used to control operations performed on data stored on memory cells in the memory array 130, including data read, data write, and data erase operations as well as logical Boolean operations such as AND, OR, XOR, etc. In various embodiments, the memory controller 140 may responsible for executing instructions from a host 110 and/or elsewhere on the memory device 120. And, as above, the memory controller 140 can be a state machine, a sequencer, or some other type of controller. For example, the controller 140 can control shifting data (e.g., right or left) in an array, e.g., memory array 130.

Figure 1C:
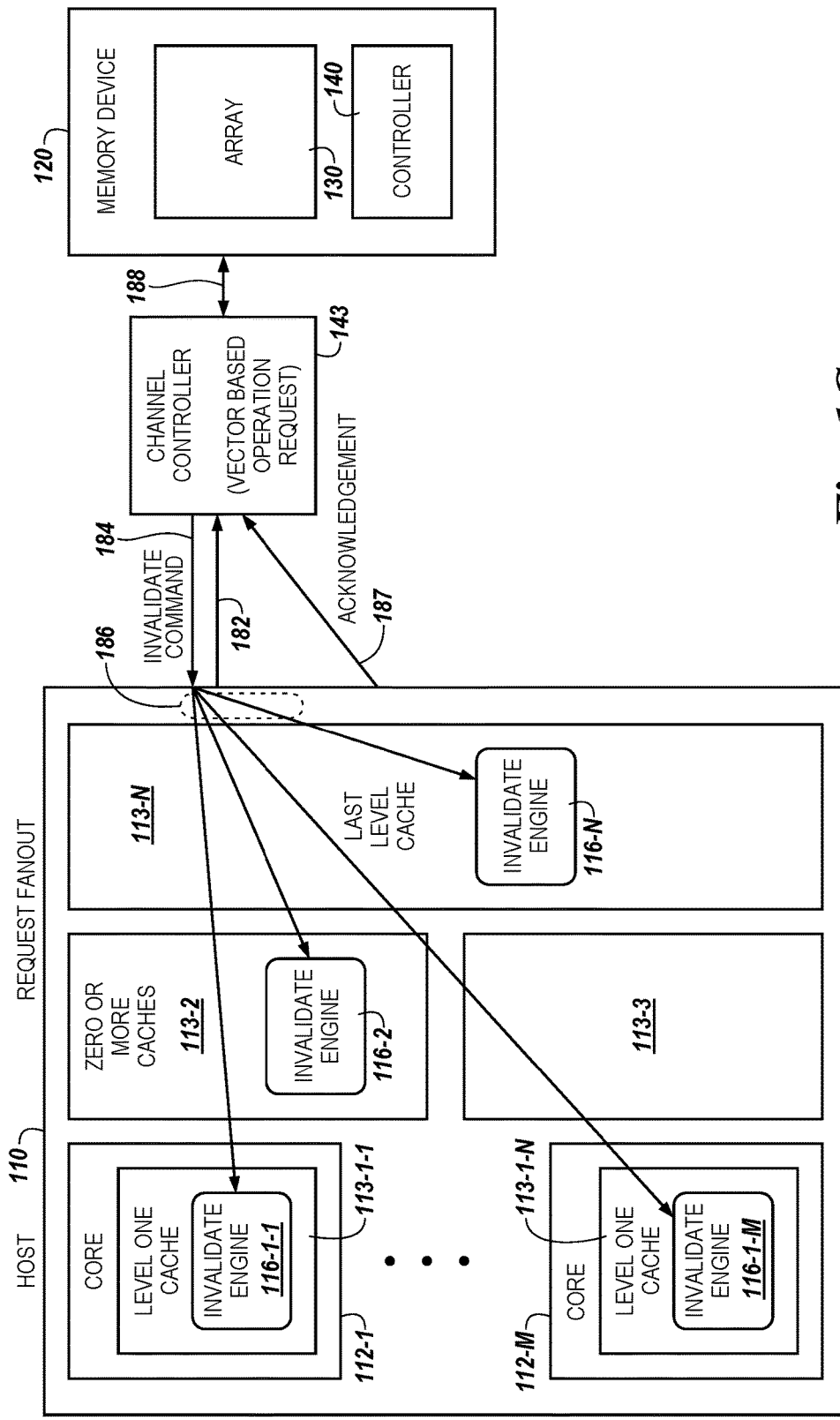
FIG. 1C is a block diagram illustrating a message exchange between a bit vector operation device, a channel controller, and a host having one or more processing resources and multiple cache levels in accordance with a number of embodiments of the present disclosure.

FIG. 1C is a block diagram illustrating a message exchange between a PIM device 120, a channel controller 143 and a host 110 having multiple processing resources 112-1, ..., 112-M, and multiple cache levels 113-1, ..., 113-N in accordance with a number of embodiments of the present disclosure. The example shown in FIG. 1C illustrates "M" processing cores, with each processing core having a first level cache, e.g., 113-1-1, ..., 113-1-M. Embodiments, however, are not so limited to a particular number of processing cores or first level caches associated with those processing cores. The variable "M" is given merely for illustration and may be the same or different from other variable number representations such as "N". As mentioned above, each level of cache may interface with a cache controller (e.g., 115 shown in FIGS. 1A and 1B) and a given cache level can have associated therewith an invalidate engine (e.g., state machine) 116-1, ..., 116-N, provided in hardware as an application specific integrated circuit (ASIC) and/or firmware, for that level of cache. In the example of FIG. 1C, an invalidate engine 116-1-1, ..., 116-1-M is shown for each level one cache (L1) associated with the processing cores 112-1, ..., 112-M.

As shown in the example of FIG. 1C a channel controller 143 may be coupled to the host 110 and to a memory device 120. The channel controller 143 can include a channel controller 143 as the same has been described above in connection with FIG. 1B. The memory device 120 can include a bit vector operation capable memory device (e.g., PIM device 120) that includes an array of memory cells 130 and a memory controller 140 as the same are described with embodiments herein.

As shown in FIG. 1C, the channel controller 143 may receive a bit vector based operation request 182 (e.g., a PIM command, PIM vector operation instruction) from a host 110 and/or from the bit vector operation memory device (e.g., PIM device). The channel controller 143 is configured with logic, in the form of hardware and/or firmware (e.g., logic 160 shown in FIG. 1B), to look at a base address for the bit vectors involved (e.g., source bit vectors and destination bit vector) in the bit vector based operation request. For example, the channel controller 143 can use logic to identify a bit vector virtual address for a bit vector operation memory device as contained in the fields of a packet received as part of the bit vector operation request 182. The channel controller 143 may be further configured to use the logic to cause a bulk invalidate command 184 to be sent to a cache memory system associated with the host 110 based on the identified bit vector virtual address. According to embodiments described herein, the bulk invalidate command 184 may be generated by the channel controller 143 and comprises a base address and a length relevant to a cache based memory system.

In some embodiments, as shown in the example of FIG. 1C, the channel controller 143 is configured with logic to send 186, e.g., broadcast, the bulk invalidate command 184 to all cache levels 113-1, ..., 113-N associated with a host 110 according to a MESI (modified, exclusive, shared, invalidate) cache coherency protocol. Upon receipt of the bulk invalidate command 184, an invalidate engine 116-1, ..., 116-N associated with each cache level 113-1, ..., 113-N will operate upon the bulk invalidate command to invalidate relevant cache lines in the respective cache level. In this manner, a single cache invalidate request may invalidate multiple contiguous cache lines at various cache levels 113-1, ..., 113-N of cache memory in the cache memory system of a host 110 that contain information, e.g., data, representing a bit vector or shape in a PIM device 120.

In an alternative embodiment, the channel controller 143 may be configured to send the bulk invalidate command 184 to a last level cache (LLC) 113-N associated with the host 110 whereupon an invalidate engine associated with the LLC 113-N may operate upon the bulk invalidate command 184 to invalidate relevant cache lines in the LLC 113-N and further send (e.g., distribute) the bulk invalidate command 184 to a next level cache, e.g., 113-3, etc., according to a directory based cache coherency protocol. Embodiments are not limited to these examples.

In at least one embodiment, the channel controller 143 may be configured with logic to generate a bulk invalidate command 184 responsive to receiving an "add" bit vector operation request in the following manner. The channel controller 143 may receive an instruction packet from the host, and/or from a bit vector operation memory device (e.g., PIM device), containing information fields. In one example, the information fields may include ADDVEC DEST, SOURCE0, SOURCE1, and VECLEN. The ADDVEC DEST, SOURCE0, SOURCE1, and VECLEN fields in an instruction packet may be a variable number of bits in length and represent various addresses to be used in an operation, e.g., a bit vector operation. In this example, the packet containing the ADDVEC DEST, SOURCE0, SOURCE1, and VECLEN fields may represent an abstract add bit vector instruction received by a bit vector operation memory device, e.g., a PIM device, which adds SOURCE0 and SOURCE1 bit vector values located at SOURCE0 and SOURCE1 virtual addresses in a PIM device and stores a resulting value from the addition operation to a destination bit vector virtual address indicated by an address in an ADDVEC DEST field to the instruction packet.

SOURCE0, SOURCE1, DEST fields may all contain bit vector "base addresses" representing a starting location address of a bit vector, associated with the bit vector operation request, in a bit vector operation memory device, e.g., PIM device. In at least one example embodiment, VECLEN may be an integer representing a bit length of a bit vector associated with a bit vector operation request. According to various embodiments the integer given by VECLEN may be in units of bytes, elements (where an element has a fixed or variable bit length), rows (e.g., rows in an array of the PIM device, the row can have a known bit length), or in units of a cache line (e.g., a cache line associated with a host or with a PIM device cache memory system, where the cache line can have a known bit length). Embodiments are not limited to these examples.

In one example embodiment the channel controller 143 comprises logic (e.g., logic 160 shown in FIG. 1B) configured to generate a bulk invalidate command relevant to each bit vector associated with a bit vector operation request. For example, in the "add" bit vector operation request example given above, referencing a DEST bit vector, a SOURCE0 bit vector, and a SOURCE1 bit vector, the logic associated with the channel controller 143 can be configured to generate three (3) bulk invalidate commands and send those to the host 110, and/or a bit vector operation memory device (e.g., PIM device), for use by a cache coherency protocol in use on the host 110, and/or bit vector operation memory device, to link the cache based system of the host 110, or other device, to a bit vector based operation on a bit vector operation memory device 120. For example, the other device may be a device operating on bit vector lengths different from a cache line bit length of the cache memory system.

To do so, the logic associated with the channel controller 143 can convert the DEST, SOURCE0, and SOURCE1 bit vector address sizes, contained in the bit vector operation request, to cache line sized addresses relevant to a given cache memory system. The cache memory system can be a host's cache memory system or that of another cache memory system, e.g., a cache memory system on the bit vector operation memory device 120. Embodiments are not so limited to a particular cache line address size associated with a particular cache based memory system. For example, a host may have a 128 byte (one kilobit (1K)) cache line address size. This example could also be expressed as a 128 byte cache line address size. In this example the bit vector operation memory device 120, e.g., PIM device, may have a 64 bit virtual address space. In order to convert the DEST, SOURCE0, and SOURCE1 bit vector address sizes of the PIM device 120, the channel controller may perform a logical AND operation on each bit value of the bit vector base addresses using a hexagonal mask value of 0xFFFFFFFFFFFFFF80 to produce a correct cache line address size.

Again, this is advantageous because if a bit vector is contained in the cache memory system on multiple cache lines, the cache memory system will not have to flush the whole cache or mark particular pages as "uncacheable", which is costly in terms of operational time, power and bandwidth consumption.

The VECLEN integer value representing the bit length value (in this example in "bytes") can be converted to a number of cache lines to be invalidated based on the above alignment. Given a bit vector address ADDR (either DEST, SOURCE0, or SOURCE1 in this example), a number of cache lines to be invalidated may be computed, e.g., by logic associated with the channel controller, according to the following:

If (((VECLEN % 128) 0) and (ADDR & 0xFFFFFFFFFFFFFF80) 0))
  NUMLINES=VECLEN/128;
  ELSE
  NUMLINES=VECLEN/128+1;

The channel controller 143 can then generate the bulk invalidate command using a base address ADDR (e.g., base address for either DEST, SOURCE0, or SOURCE1) and NUMLINES as an argument to send to a routine in the cache coherency protocol scheme of a given cache based memory system, e.g., associated with the host 110, PIM device cache system, etc. NUMLINES allows for the invalidation of every cache line that is part of the vector in the case that the vector is not a multiple of the number of cache lines. This bulk invalidate command may be sent to any cache memory system that may be caching memory, e.g., another device, PIM device, etc. Each cache level 113-1, . . . , 113-N associated with a processing resource receiving the bulk invalidate command may use an associated invalidate engine (e.g., state machine) 116-1, . . . , 116-N to generate a cache invalidation for any line that may be cached in that respective cache level 113-1, . . . , 113-N. By way of example, and not by way of limitation, for (i=0; i<numlines; i++{if(M(ADDR+i*128) is in this cache) {invalidate and if required by the cache coherency protocol policy flush the line (e.g., if the line is dirty)}}

As shown in FIG. 1C, at the end of the invalidate operation according to the cache coherency protocol of the cache memory system, the cache memory system, e.g., on host 110, may respond to the channel controller 143 with an acknowledgement 187 that the invalidation is complete. According to some embodiments, responsive to the channel controller 143 receiving the acknowledgement 187 that all validations are complete, the channel controller 143 can instruct at 188 a bit vector operation memory device 120 to perform a bit vector operation associated with the bit vector operation request received by the channel controller 143. For example, the channel controller can send an instruction 188 to a memory controller 140 (e.g., sequencer) on the bit vector operation memory device 120 (e.g., PIM device) to begin the bit vector operation (e.g., PIM vector operation) indicated in the bit vector operation request. In various embodiments, the channel controller 143 may instruct a PIM device 120 to begin the bit vector operations using a control 154 and/or data bus 156 as shown in FIG. 1B.

As the reader will appreciate, in at least one alternative embodiment the channel controller 143 may generate a bulk invalidate command and send it for use by a cache coherency protocol to link a cache based memory system to a bit vector based operation on a bit vector operation memory device, by calculating an address range to invalidate in the cache based memory system. One example embodiment to this approach can comprise the channel controller generating the address range to invalidate according to the following calculation.

Inclusive (ADDR/cache line size) . . . ((ADDR+ VECLEN+1)/case line size) exclusive.

In additional embodiments, logic (e.g., 160 in FIG. 1B) associated with the channel controller 143 may be used to track ongoing bit vector operations on a bit vector operation memory device 120 in order to operate as a transactional based memory. For example, the channel controller 143 can track ongoing PIM operations over the bit vectors (e.g., ADDR to ADDR+(VECLEN*128) in the above example) to modify the behavior of responses to access requests to a cache memory system according to the cache coherency protocol.

Thus, according to various disclosed embodiments, a method for operating a memory may include the bulk invalidate command, generated by the channel controller and sent to the cache memory system, comprising instructions to the cache memory system to temporarily deny "exclusive access" (e.g., in a MESI cache coherency protocol) or to update requests to an invalidated portion of the cache memory while the PIM bit vector operation is being performed. The bulk invalidate command instructions may also include instructions to suspend exclusive access or update requests to an invalidated portion of the cache memory until the PIM bit vector operation is complete or can be interrupted.

Further the bulk invalidate command instructions may include instructions to allow read access to an invalidated portion of the cache memory while the PIM bit vector operation is being performed. The bulk invalidate command instructions may include instructions to add meta data to a cache coherency protocol of the cache memory system and to mark a cache line as in-use elsewhere and not shared. The bulk invalidate command instructions can include instructions to stop the PIM bit vector operation to allow a cache operation to complete. And, the bulk invalidate command instructions can include instructions to stop the PIM bit vector operation, to reschedule the PIM bit vector operation, to temporarily provide access to requested cache data, and to generate a new bulk invalidate command to the cache memory system to resume the PIM bit vector operation. Embodiments, however, are not limited to these examples.

Figure 1D:
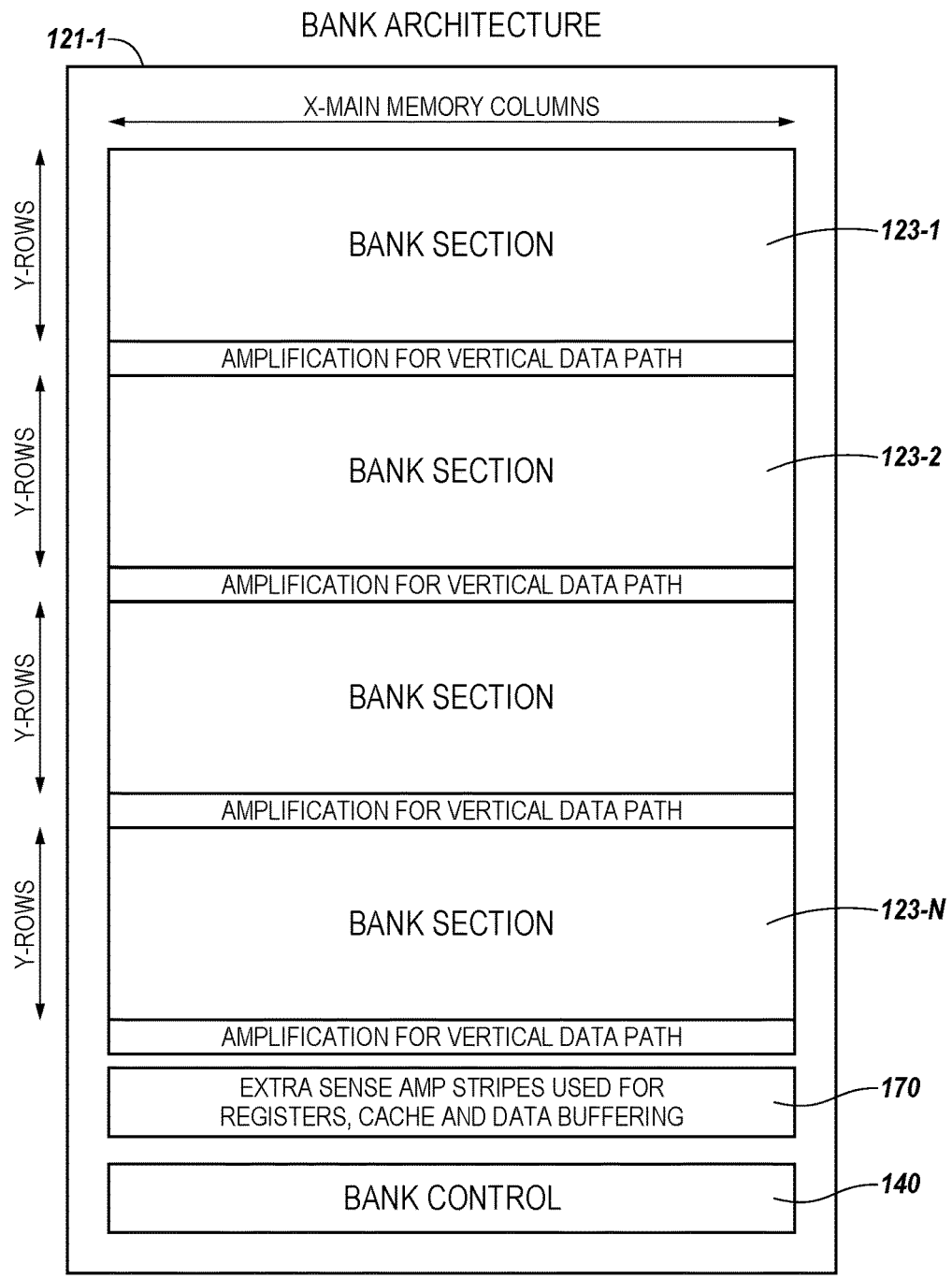
FIG. 1D is a block diagram of a bank to a memory device in accordance with a number of embodiments of the present disclosure.

FIG. 1D is a block diagram of a bank 121-1 to a memory device in accordance with a number of embodiments of the present disclosure. For example, bank 121-1 can represent an example bank to a memory device such as Bank 0, . . . , Bank 7 (121-0, . . . , 121-7) shown in FIG. 1B. As shown in FIG. 1D, a bank architecture can include a plurality of main memory columns (shown horizontally as X), e.g., 16,384 columns in an example DRAM bank. Additionally, the bank 121-1 may be divided up into sections, 123-1, 123-2, . . . , 123-N, separated by amplification regions for a data path. Each of the of the bank sections 123-1, . . . , 123-N can include a plurality of rows (shown vertically as Y), e.g., each section may include 16,384 rows in an example DRAM bank. Example embodiments are not limited to the example horizontal and/or vertical orientation of columns and rows described here or the example numbers thereof.

As shown in FIG. 1D, the bank architecture can include logic circuitry 170, including sense amplifiers, registers, cache and data buffering, that is coupled to the bank sections 123-1, . . . , 123-N. The logic circuitry 170 can provide another form of cache associated with the memory controller 140, e.g., such as logic circuitry 170 associated with the sensing circuitry 150 and array 130 as shown in FIG. 1A. Further, as shown in FIG. 1D, the bank architecture can be associated with bank control, e.g., memory controller, 140. The bank control shown in FIG. 1D can, in example, represent at least a portion of the functionality embodied by and contained in the memory controller 140 shown in FIGS. 1A and 1B.

Figure 1E:
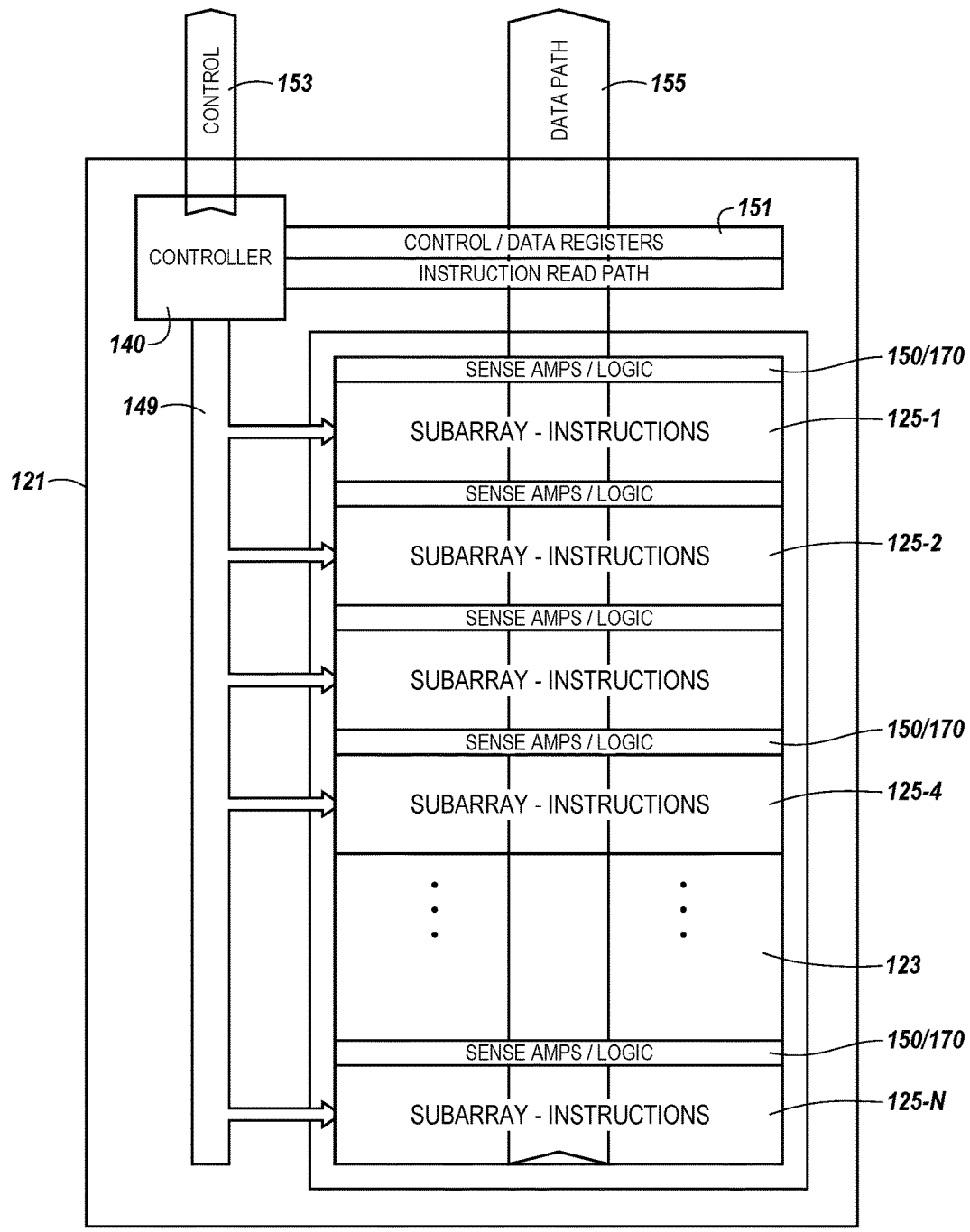
FIG. 1E is another block diagram of a bank to a memory device in accordance with a number of embodiments of the present disclosure.

FIG. 1E is another block diagram of a bank 121 to a memory device in accordance with a number of embodiments of the present disclosure. For example, bank 121 can represent an example bank to a memory device such as Bank 0, . . . , Bank 7 (121-0, . . . , 121-7) shown in FIG. 1B. As shown in FIG. 1E, a bank architecture can include an address/control (A/C) path, e.g., control bus, 153 coupled to a controller 140. Again, the controller 140 shown in FIG. 1E can, in example, represent at least a portion of the functionality embodied by and contained in the memory controller 140 shown in FIGS. 1A and 1B. Also, as shown in FIG. 1C, a bank architecture can include a data path, e.g., bus, 155, coupled to a plurality of control/data registers in an instruction, e.g., program instructions (PIM commands), read path and coupled to a plurality of bank sections, e.g., bank section 123, in a particular bank 121.

Figure 2:
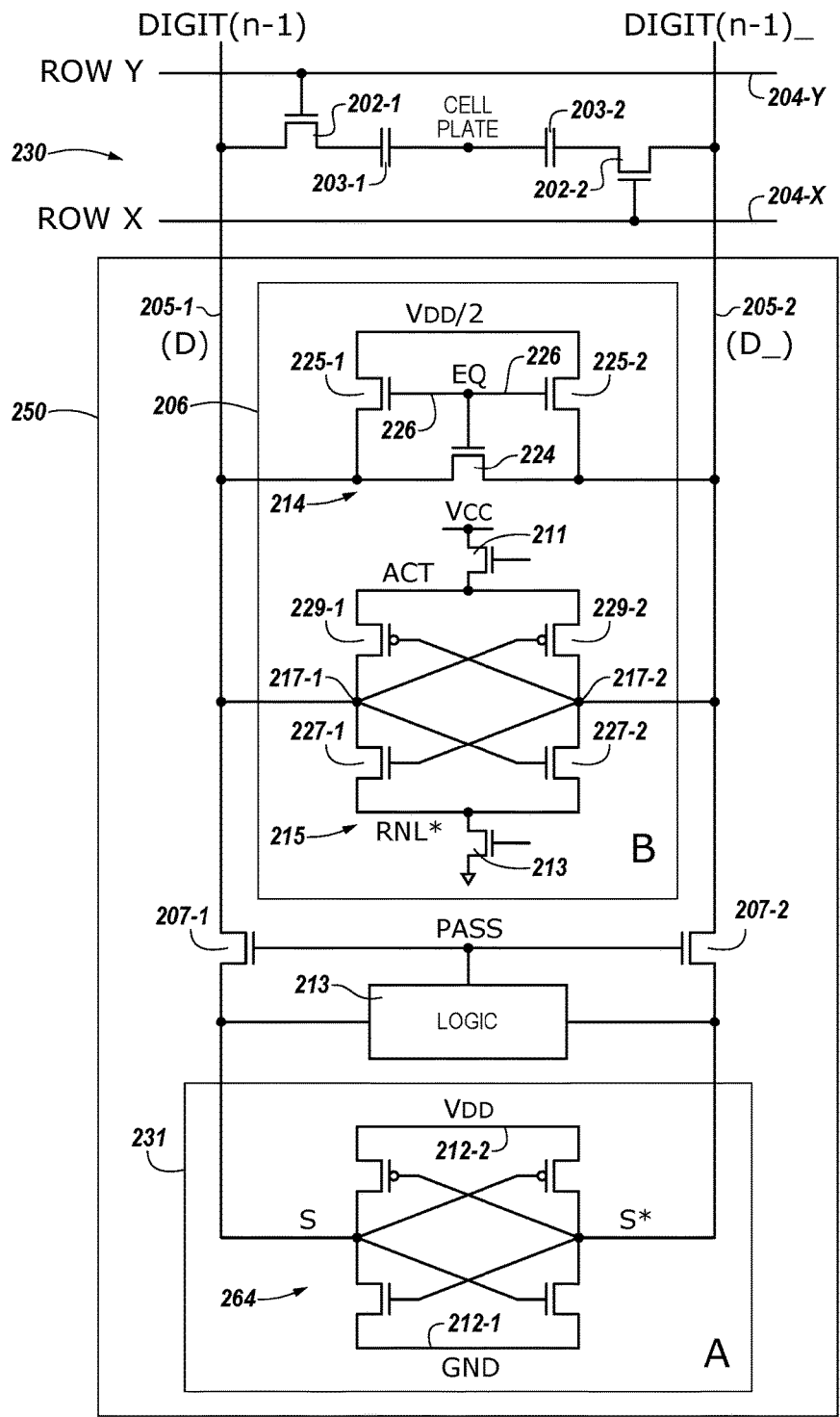
FIG. 2 is a schematic diagram illustrating sensing circuitry to a memory device in accordance with a number of embodiments of the present disclosure.
Figure 3:
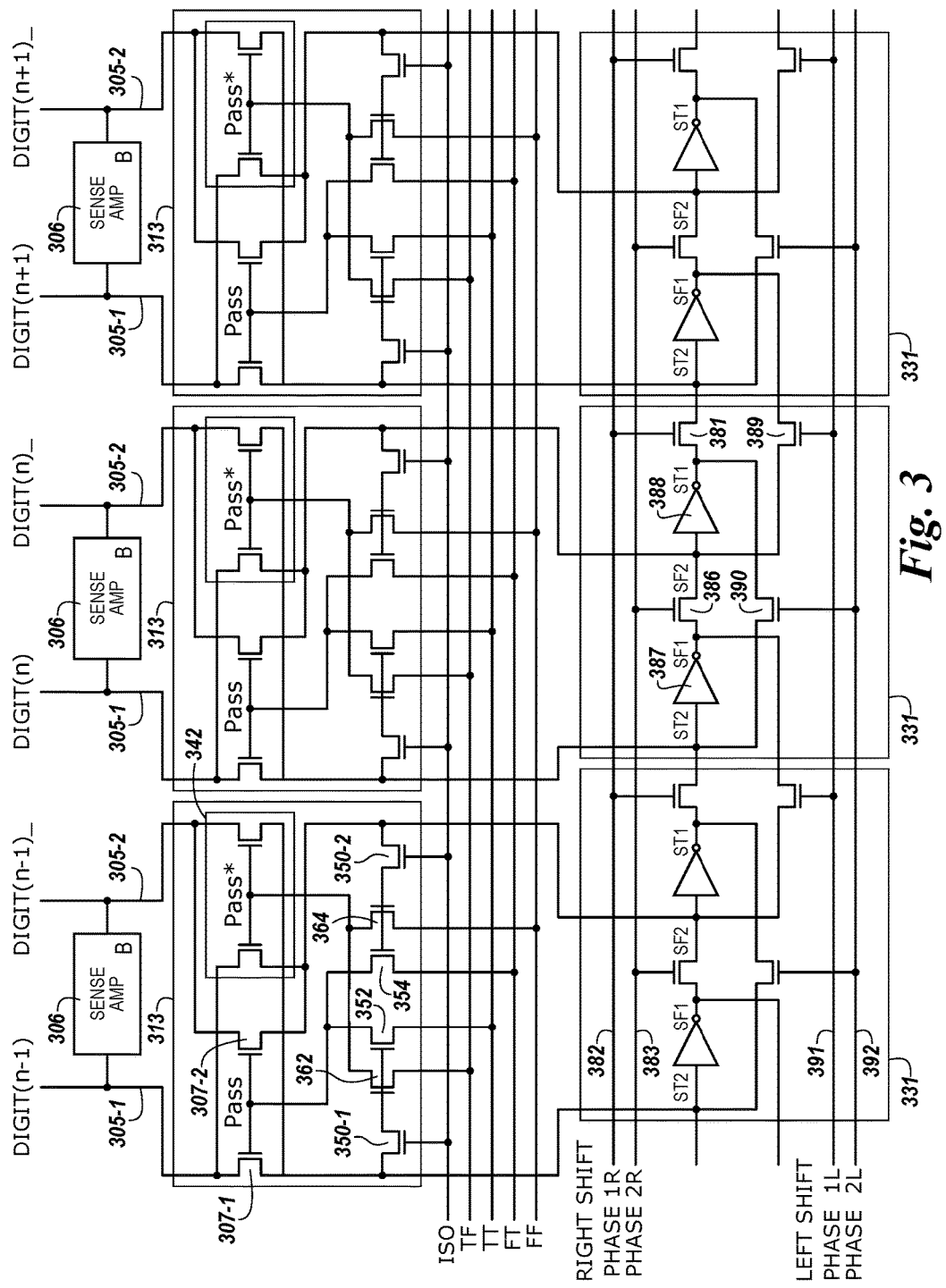
FIG. 3 is a schematic diagram illustrating sensing circuitry to a memory device in accordance with a number of embodiments of the present disclosure.
Figure 4:
FIG. 4 is a logic table illustrating selectable logic operation results implemented by a sensing circuitry shown in FIG. 3 in accordance with a number of embodiments of the present disclosure.

As shown in FIG. 1E, a bank section 123 can be further subdivided into a plurality of sub-arrays (or subarrays) 125-1, 125-2, . . . , 125-N again separated by of plurality of sensing circuitry and logic 150/170 as shown in FIG. 1A and described further in connection with FIGS. 2-4. In one example, a bank section 121 may be divided into sixteen (16) subarrays. However, embodiments are not limited to this example number.

FIG. 1E, illustrates a bank control/sequencer 140 coupled to a write path 149 and coupled to each of the subarrays 125-1, . . . , 125-N in the bank 123. Alternatively or additionally, logic circuitry 170 shown in FIG. 1A may be used as an instruction cache, e.g., used to cache and/or re-cache retrieved instructions local ("on-pitch") to a particular bank. In at least one embodiment, the plurality of subarrays 125-1, . . . , 125-N, and/or portions of the plurality of subarrays, may be referred to as a plurality of locations for storing program instructions, e.g., PIM commands, and/or constant data to a bank 123 in a memory device.

According to embodiments of the present disclosure, the memory controller 140, e.g. bank control/sequencer 140 shown in FIG. 1B, is configured to receive a block of instructions and/or constant data from a host, e.g., host 110 in FIG. 1A. Alternatively, the block of instructions and/or constant data may be received to the memory controller 140 from a channel controller 143 either integrated with the host 110 or separate from the host, e.g., integrated in the form of a module 118 with a plurality of memory devices, 120-1, . . . , 120-N, as shown in FIG. 1B.

The block of instructions and/or data can include a set of program instructions, e.g. PIM commands, and/or constant data, e.g., data to set up for PIM calculations. According to embodiments, the memory controller 140 is configured to store the block of instructions and/or constant data from the host 110 and/or channel controller 143 associated with an array, e.g., array 130 shown in FIG. 1A and/or bank section 123 (shown in FIGS. 1D/1E), of a bank, e.g., banks 121-0, . . . , 121-7, shown in FIGS. 1B, 1D and 1E. The memory controller 140 is further configured, e.g. includes logic in the form of hardware circuitry and/or application specific integrated circuitry (ASIC), to route the program instructions to the sensing circuitry, including a compute component, such as sensing circuitry shown as 150 in FIG. 1A and compute components 231 and 331 in FIGS. 2 and 3, to perform logical functions and/or operations, e.g., program instruction execution, as described herein.

As shown in FIG. 1E, in at least one embodiment the memory controller 140 is configured to use DRAM protocol and DRAM logical and electrical interfaces to receive the program instructions and/or constant data from the host 110 and/or channel controller 143 and to route the program instructions and/or constant data to a compute component of sensing circuitry 150, 250 and/or 350. The program instructions and/or constant data received to the memory controller 140 can be pre-resolved, e.g., pre-defined, by a programmer and/or provided to the host 110 and/or channel controller 143.

In some embodiments, as seen in FIG. 1B, the array of memory cells (130 in FIG. 1A) includes a plurality of bank of memory cells 120-1, . . . , 120-N and the memory device 120 includes a bank arbiter 145 coupled to each of the plurality of banks 120-1, . . . , 120-N. In such embodiments, each bank arbiter is configured to receive an instruction block of program instructions and/or constant data relevant to a particular bank from the bank arbiter 145. The memory controller 140 can then store instructions in the received instruction block and/or constant data to a plurality of locations for the particular bank as allocated by the host 110 and/or channel controller 143. For example, the host 110 and/or channel controller 143 is configured to address translate the plurality of locations for the bank arbiter 145 to assign to banks of the memory device 120.

In at least one embodiment, as shown in FIG. 1E, the plurality of locations includes a number of subarrays 125-1, . . . , 125-N in the DRAM banks 121-1, . . . , 121-7 and/or portions of the number of subarrays. According to embodiments, each memory controller 140 can be configured to receive cache lines 160 from the host 110 and/or channel controller 143, e.g., on A/C bus 154, to store cache blocks received to a given bank, 121-1, . . . , 121-7. The memory controller 140 is configured to then retrieve cache block data, e.g., on read data path 155 with control and data registers 151, from the plurality of locations for the particular bank and execute using the compute component of the sensing circuitry 150. The memory controller 140 can cache retrieved cache blocks local to the particular bank, e.g. array 130, bank sections 123 and/or subarray 125, to handle branches, loops, logical and data operations contained within the instructions block execution. And, the memory controller 140 can re-cache retrieved instructions as needed. Thus, the size of the dedicated instruction memory (cache) on the DRAM part does not have to be increased for a PIM system.

In some embodiments, a plurality of memory devices 120-1, . . . , 120-N are coupled to a host 110 and/or channel controller 143. Here, the host 110 and/or channel controller 143 can send cache blocks to an appropriate bank arbiter 145-1, . . . , 145-N for the plurality of memory devices, 120-1, . . . , 120-N, e.g., over a data bus 156.

Further, according to embodiments, the memory controller 140 is configured such that a bank 121 can receive a subsequent cache line 160 associated with another cache block relevant to the particular bank and used the block select 162 and subrow select 163 metadata data structures in the received cache lines 160 to store and access cache blocks to/from a plurality of locations for the particular bank while, e.g., in parallel, the memory controller 140 is operating on another previously retrieved cache block. Hence, the embodiments described herein avoid needing to wait for future, or a next set of cache block access instructions, e.g., PIM commands, to be received from a host 110 and/or channel controller 143. Instead, the apparatus and methods devices described herein facilitate the memory device 120 functioning as a last layer cache (LLC) in a DRAM part for cache blocks and can facilitate a compute enabled cache directly on-chip, on-pitch with the memory device 120 in the PIM system, e.g., PIMRAM.

As the reader will appreciate, and as described in more detail in the examples of FIGS. 2-4, the memory controller 140 is configured to control the execution of program instructions, e.g., PIM commands, by controlling the sensing circuitry 150, including compute components 251 and/or 351, to implement logical functions such as AND, OR, NOT, NAND, NOR, and XOR logical functions. Additionally the memory controller 140 is configured to control the sensing circuitry 150 to perform non-Boolean logic operations, including copy, compare and erase operations, as part of executing program instructions, e.g., PIM commands.

FIG. 2 is a schematic diagram illustrating sensing circuitry 250 in accordance with a number of embodiments of the present disclosure. The sensing circuitry 250 can correspond to sensing circuitry 150 shown in FIG. 1A. A memory cell comprises a storage element (e.g., capacitor) and an access device (e.g., transistor). For instance, a first memory cell comprises transistor 202-1 and capacitor 203-1, and a second memory cell comprises transistor 202-2 and capacitor 203-2, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 230 can be arranged in rows coupled by word lines 204-X (Row X), 204-Y (Row Y), etc., and columns coupled by pairs of complementary sense lines (e.g., data lines DIGIT(n−1)/DIGIT(n−1)_, DIGIT(n)/DIGIT(n)_, DIGIT(n+1)/DIGIT(n+1)_). The individual sense lines corresponding to each pair of complementary sense lines can also be referred to as data lines 205-1 (D) and 205-2 (D_) respectively. Although only one pair of complementary data lines are shown in FIG. 2, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can be coupled to the pair of complementary sense lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary sense lines un-transposed between the sense amplifier 206 and the compute component 231 (as shown in FIG. 2) and/or swap gate logic for controlling swap gates that couple the pair of complementary sense lines transposed between the sense amplifier 206 and the compute component 231. The logical operation selection logic 213 can also be coupled to the pair of complementary sense lines 205-1 and 205-2. The logical operation selection logic 213 can be configured to control continuity of pass gates 207-1 and 207-2 based on a selected logical operation, as described in detail below for various configurations of the logical operation selection logic 213.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary data lines D 205-1 and D_ 205-2. However, embodiments are not limited to this example. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as a primary latch.

In operation, when a memory cell is being sensed (e.g., read), the voltage on one of the data lines 205-1 (D) or 205-2 (D_) will be slightly greater than the voltage on the other one of data lines 205-1 (D) or 205-2 (D_). An ACT signal and the RNL* signal can be driven low to enable (e.g., fire) the sense amplifier 206. The data lines 205-1 (D) or 205-2 (D_) having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage $V_{CC}$ through source transistor 211, and the other data line 205-1 (D) or 205-2 (D_) is driven to the voltage of the reference voltage (e.g., ground) through the sink transistor 213. Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell.

Embodiments are not limited to the sense amplifier 206 configuration illustrated in FIG. 2. As an example, the sense amplifier 206 can be current-mode sense amplifier and/or single-ended sense amplifier (e.g., sense amplifier coupled to one data line). Also, embodiments of the present disclosure are not limited to a folded data line architecture such as that shown in FIG. 2.

The sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The sense amplifier 206 can further include equilibration circuitry 214, which can be configured to equilibrate the data lines 205-1 (D) and 205-2 (D_). In this example, the equilibration circuitry 214 comprises a transistor 224 coupled between data lines 205-1 (D) and 205-2 (D_). The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled data line 205-1 (D), and a second source/drain region of transistor 225-2 can be coupled data line 205-2 (D_). Gates of transistors 224, 225-1, and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage (e.g., $V_{DD}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry 250 (e.g., sense amplifier 206 and compute component 231) can be operated to perform a selected logical operation and initially store the result in one of the sense amplifier 206 or the compute component 231 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logic functions are used in many higher level functions. Consequently, speed and/or power efficiencies that can be realized with improved logical operations, can translate into speed and/or power efficiencies of higher order functionalities.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 2 at 231, and various other embodiments are described further below.

FIG. 3 is a schematic diagram illustrating sensing circuitry capable of implementing an XOR logical operation in accordance with a number of embodiments of the present disclosure. FIG. 3 shows a sense amplifier 306 coupled to a pair of complementary sense lines 305-1 and 305-2, and a compute component 331 coupled to the sense amplifier 306 via pass gates 307-1 and 307-2. The sense amplifier 306 shown in FIG. 3 can correspond to sense amplifier 206 shown in FIG. 2. The compute component 331 shown in FIG. 3 can correspond to sensing circuitry, including compute component, 150 shown in FIG. 1A. The logical operation selection logic 313 shown in FIG. 3 can correspond to logical operation selection logic 213 shown in FIG. 2.

The gates of the pass gates 307-1 and 307-2 can be controlled by a logical operation selection logic signal, Pass. For example, an output of the logical operation selection logic can be coupled to the gates of the pass gates 307-1 and 307-2. The compute component 331 can comprise a loadable shift register configured to shift data values left and right.

The sensing circuitry shown in FIG. 3 also shows a logical operation selection logic 313 coupled to a number of logic selection control input control lines, including ISO, TF, TT, FT, and FF. Selection of a logical operation from a plurality of logical operations is determined from the condition of logic selection control signals on the logic selection control input lines, as well as the data values present on the pair of complementary sense lines 305-1 and 305-2 when the isolation transistors 350-1 and 350-2 are enabled via the ISO control signal being asserted.

According to various embodiments, the logical operation selection logic 313 can include four logic selection transistors: logic selection transistor 362 coupled between the gates of the swap transistors 342 and a TF signal control line, logic selection transistor 352 coupled between the gates of the pass gates 307-1 and 307-2 and a TT signal control line, logic selection transistor 354 coupled between the gates of the pass gates 307-1 and 307-2 and a FT signal control line, and logic selection transistor 364 coupled between the gates of the swap transistors 342 and a FF signal control line. Gates of logic selection transistors 362 and 352 are coupled to the true sense line through isolation transistor 350-1 (having a gate coupled to an ISO signal control line). Gates of logic selection transistors 364 and 354 are coupled to the complementary sense line through isolation transistor 350-2 (also having a gate coupled to an ISO signal control line).

Data values present on the pair of complementary sense lines 305-1 and 305-2 can be loaded into the compute component 331 via the pass gates 307-1 and 307-2. The compute component 331 can comprise a loadable shift register. When the pass gates 307-1 and 307-2 are OPEN, data values on the pair of complementary sense lines 305-1 and 305-2 are passed to the compute component 331 and thereby loaded into the loadable shift register. The data values on the pair of complementary sense lines 305-1 and 305-2 can be the data value stored in the sense amplifier 306 when the sense amplifier is fired. The logical operation selection logic signal, Pass, is high to OPEN the pass gates 307-1 and 307-2.

The ISO, TF, TT, FT, and FF control signals can operate to select a logical function to implement based on the data value ("B") in the sense amplifier 306 and the data value ("A") in the compute component 331. In particular, the ISO, TF, TT, FT, and FF control signals are configured to select the logical function to implement independent from the data value present on the pair of complementary sense lines 305-1 and 305-2 (although the result of the implemented logical operation can be dependent on the data value present on the pair of complementary sense lines 305-1 and 305-2. For example, the ISO, TF, TT, FT, and FF control signals select the logical operation to implement directly since the data value present on the pair of complementary sense lines 305-1 and 305-2 is not passed through logic to operate the gates of the pass gates 307-1 and 307-2.

Additionally, FIG. 3 shows swap transistors 342 configured to swap the orientation of the pair of complementary sense lines 305-1 and 305-2 between the sense amplifier 306 and the compute component 331. When the swap transistors 342 are OPEN, data values on the pair of complementary sense lines 305-1 and 305-2 on the sense amplifier 306 side of the swap transistors 342 are oppositely-coupled to the pair of complementary sense lines 305-1 and 305-2 on the compute component 331 side of the swap transistors 342, and thereby loaded into the loadable shift register of the compute component 331.

The logical operation selection logic signal Pass can be activated (e.g., high) to OPEN the pass gates 307-1 and 307-2 (e.g., conducting) when the ISO control signal line is activated and either the TT control signal is activated (e.g., high) and data value on the true sense line is "1" or the FT control signal is activated (e.g., high) and the data value on the complement sense line is "1."

The data value on the true sense line being a "1" OPENs logic selection transistors 352 and 362. The data value on the complimentary sense line being a "1" OPENs logic selection transistors 354 and 364. If the ISO control signal or either the respective TT/FT control signal or the data value on the corresponding sense line (e.g., sense line to which the gate of the particular logic selection transistor is coupled) is not high, then the pass gates 307-1 and 307-2 will not be OPENed by a particular logic selection transistor.

The logical operation selection logic signal Pass* can be activated (e.g., high) to OPEN the swap transistors 342 (e.g., conducting) when the ISO control signal line is activated and either the TF control signal is activated (e.g., high) with data value on the true sense line is "1," or the FF control signal is activated (e.g., high) with the data value on the complement sense line is "1." If either the respective control signal or the data value on the corresponding sense line (e.g., sense line to which the gate of the particular logic selection transistor is coupled) is not high, then the swap transistors 342 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 3 is configured to select one of a plurality of logical operations to implement directly from the four logic selection control signals (e.g., logical operation selection is not dependent on the data value present on the pair of complementary sense lines). Some combinations of the logic selection control signals can cause both the pass gates 307-1 and 307-2 and swap transistors 342 to be OPEN at the same time, which shorts the pair of complementary sense lines 305-1 and 305-2 together. According to a number of embodiments of the present disclosure, the logical operations which can be implemented by the sensing circuitry illustrated in FIG. 3 can be the logical operations summarized in the logic tables shown in FIG. 4.

FIG. 4 is a logic table illustrating selectable logic operation results implemented by a sensing circuitry shown in FIG. 3 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 306 and compute component 331. The four control signals, in conjunction with a particular data value present on the complementary sense lines, controls the continuity of the pass gates 307-1 and 307-2 and swap transistors 342, which in turn affects the data value in the compute component 331 and/or sense amplifier 306 before/after firing. The capability to selectably control continuity of the swap transistors 342 facilitates implementing logical operations involving inverse data values (e.g., inverse operands and/or inverse result), among others.

Logic Table 4-1 illustrated in FIG. 4 shows the starting data value stored in the compute component 331 shown in column A at 444, and the starting data value stored in the sense amplifier 306 shown in column B at 445. The other 3 column headings in Logic Table 4-1 refer to the continuity of the pass gates 307-1 and 307-2, and the swap transistors 342, which can respectively be controlled to be OPEN or CLOSED depending on the state of the four logic selection control signals (e.g., TF, TT, FT, and FF), in conjunction with a particular data value present on the pair of complementary sense lines 305-1 and 305-2. The "Not Open" column corresponds to the pass gates 307-1 and 307-2 and the swap transistors 342 both being in a non-conducting condition, the "Open True" corresponds to the pass gates 307-1 and 307-2 being in a conducting condition, and the "Open Invert" corresponds to the swap transistors 342 being in a conducting condition. The configuration corresponding to the pass gates 307-1 and 307-2 and the swap transistors 342 both being in a conducting condition is not reflected in Logic Table 4-1 since this results in the sense lines being shorted together.

Via selective control of the continuity of the pass gates 307-1 and 307-2 and the swap transistors 342, each of the three columns of the upper portion of Logic Table 4-1 can be combined with each of the three columns of the lower portion of Logic Table 4-1 to provide 3×3=9 different result combinations, corresponding to nine different logical operations, as indicated by the various connecting paths shown at 475. The nine different selectable logical operations that can be implemented by the sensing circuitry (e.g., 150 in FIG. 1A) are summarized in Logic Table 4-2 illustrated in FIG. 4, including an XOR logical operation.

The columns of Logic Table 4-2 illustrated in FIG. 4 show a heading 480 that includes the state of logic selection control signals. For example, the state of a first logic selection control signal is provided in row 476, the state of a second logic selection control signal is provided in row 477, the state of a third logic selection control signal is provided in row 478, and the state of a fourth logic selection control signal is provided in row 479. The particular logical operation corresponding to the results is summarized in row 447.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a bit vector operation capable memory device configured to;
   convert a bit vector bit length to a number of cache lines to be invalidated; and
   generate a bulk invalidate command according to a cache coherency protocol of a cache memory system, wherein the bulk invalidate command uses the number of cache lines to be invalidated as an argument, wherein generating the bulk invalidate command, comprises:
      providing a base address and the number of cache lines to be invalidated as an argument in packet fields sent to the cache memory system.

2. The apparatus of claim 1, wherein the apparatus is further configured to convert an address of the bit vector to a cache line sized address relevant to the cache memory system, wherein the bulk invalidate command uses the cache line sized address as a base address and wherein converting the address of the bit vector comprises performing a logical AND operation using the address of the bit vector and a mask.

3. The apparatus of claim 1, the bit vector operation capable memory device, comprising:
an array of memory cells;
sensing circuitry coupled to the array, the sensing circuitry including sense amplifiers and a compute component configured to implement logical operations; and
a memory controller coupled to the array and sensing circuitry, the memory controller configured to receive the bit vector based operation request.

4. The apparatus of claim 1, wherein:
the bit vector based operation request is associated with a processor in memory (PIM) command; and
a bit vector based operation is a PIM operation.

5. The apparatus of claim 1, wherein a channel controller is configured to generate the bulk invalidate command, the bulk invalidate command comprising a base address and a length expressed as a number of cache lines.

6. The apparatus of claim 1, wherein the cache memory system has a MESI (modified, exclusive, shared, invalid) cache coherency protocol.

7. The apparatus of claim 1, wherein the cache memory system has a directory based cache coherency protocol.

8. The apparatus of claim 1, wherein the channel controller is configured to send the bulk invalidate command to all cache levels in the cache memory system.

9. The apparatus of claim 1, wherein the channel controller is configured to send the bulk invalidate command to a last level cache (LLC) in the cache memory system and the LLC further sends to another level of cache memory according to a directory based cache coherency protocol.

10. The apparatus of claim 1, wherein an invalidate engine associated with the LLC is configured to further send the bulk invalidate command to another level of cache memory.

11. The apparatus of claim 1, wherein the channel controller is configured to send the bulk invalidate command to multiple cache levels in the cache memory system.

12. The apparatus of claim 1, wherein the channel controller is configured receive a processor in memory (PIM) bit vector operation request and further configured to generate the bulk invalidate command from a base address length associated with a bit vector to be used in the PIM bit vector operation.

13. The apparatus of claim 1, wherein the channel controller is configured to convert the length of the bit vector to a number of cache lines relevant to a cache line sized address in the cache memory system.

14. An apparatus, comprising:
a channel controller configured to:
receive a bit vector operation request; and
send a bulk invalidate command to a cache memory system responsive to receiving the bit vector operation request to free up space in the cache memory system for use by a bit vector operation;
modify a behavior of a cache coherency protocol associated with the cache memory system for responses to caching requests; and
allow read access to an invalidated portion of the cache memory system while the bit vector operation is being performed.

15. The apparatus of claim 14, wherein the channel controller is further configured to track the bit vector operation performed responsive to receiving the bit vector operation request.

16. The apparatus of claim 14, wherein modify the behavior comprises:
temporarily denying exclusive access or update requests to an invalidated portion of the cache memory system while the bit vector operation is being performed.

17. The apparatus of claim 14, wherein modify the behavior comprises:
suspending exclusive access or update requests to an invalidated portion of the cache memory system until the bit vector operation is complete or can be interrupted.

18. The apparatus of claim 14, wherein modify the behavior comprises:
adding meta data to the cache coherency protocol of the cache memory system; and
marking a cache line as in-use elsewhere and not shared.

* * * * *